(12) United States Patent
Park et al.

(10) Patent No.: US 10,840,270 B2
(45) Date of Patent: Nov. 17, 2020

(54) DISPLAY DEVICE

(71) Applicant: Samsung Display Co., Ltd., Yongin-si (KR)

(72) Inventors: Doyeong Park, Hwaseong-si (KR); Seongyoung Lee, Hwaseong-si (KR); Jaeho Choi, Seoul (KR); Seulbee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/161,090

(22) Filed: Oct. 16, 2018

(65) Prior Publication Data

US 2019/0288008 A1    Sep. 19, 2019

(30) Foreign Application Priority Data

Mar. 19, 2018  (KR) .......................... 10-2018-0031582

(51) Int. Cl.
*H01L 27/12* (2006.01)
*G09G 3/20* (2006.01)

(52) U.S. Cl.
CPC ............. *H01L 27/124* (2013.01); *G09G 3/20* (2013.01); *G09G 2310/027* (2013.01); *G09G 2310/0243* (2013.01); *G09G 2310/0267* (2013.01); *G09G 2310/0286* (2013.01); *G09G 2310/08* (2013.01)

(58) Field of Classification Search
CPC ....................... H01L 33/38–387; H01L 27/124
See application file for complete search history.

(56) References Cited

U.S. PATENT DOCUMENTS

| | | | |
|---|---|---|---|
| 8,687,162 B2 | 4/2014 | Nam et al. | |
| 9,275,593 B2 | 3/2016 | Kim et al. | |
| 9,733,538 B2 | 8/2017 | Ogasawara et al. | |
| 2006/0056267 A1 | 3/2006 | Kim et al. | |
| 2009/0016001 A1* | 1/2009 | Miyakawa | G02F 1/133555 |
| | | | 361/679.21 |

FOREIGN PATENT DOCUMENTS

| | | |
|---|---|---|
| KR | 10-1014172 | 2/2011 |
| KR | 10-1359864 | 2/2014 |
| KR | 10-1759985 | 7/2017 |

* cited by examiner

*Primary Examiner* — Amar Movva
(74) *Attorney, Agent, or Firm* — H.C. Park & Associates, PLC

(57) ABSTRACT

A display device including: a first substrate; a first conductive line disposed on the first substrate; an insulating layer disposed on the first conductive line; a second conductive line disposed on the first conductive line and the insulating layer; a protective layer disposed on the second conductive line; a plurality of first contact holes defined by the insulating layer and the protective layer; a plurality of second contact holes defined by the protective layer; and a conductive layer disposed over the plurality of first contact holes and the plurality of second contact holes, and connecting the first conductive line and the second conductive line. The plurality of first contact holes and the plurality of second contact holes are arranged alternately along a first direction and along a second direction which intersects the first direction.

20 Claims, 13 Drawing Sheets

DISPLAY DEVICE

CROSS-REFERENCE TO RELATED APPLICATION

This application claims priority from and the benefit of Korean Patent Application No. 10-2018-0031582, filed on Mar. 19, 2018, which is hereby incorporated by reference for all purposes as if fully set forth herein.

BACKGROUND

Field

Exemplary embodiments of the invention relate generally to a display device, and more specifically, to a display device capable of substantially preventing burn defects resulting from overheating caused by overcurrent by reducing the resistance of wirings.

Discussion of the Background

Liquid crystal display ("LCD") devices are one of the most widely used types of flat panel display ("FPD") devices. Such an LCD device includes two substrates on which electrodes are formed and a liquid crystal layer interposed therebetween. An LCD device is a display device that adjusts the amount of transmitted light by applying voltage to the two electrodes and rearranging liquid crystal molecules of the liquid crystal layer.

Gate lines included in such an LCD device are driven by a gate driver.

The gate driver receives clock signals from clock lines and generates gate signals. In such a case, the clock lines are connected to the gate driver through contact holes. In the case of ultra-high resolution display devices, the number of contact holes for connecting the clock line and the gate driver decreases, and thus, the resistance of the clock line increases and the burn defects may occur due to overheating caused by overcurrent.

The above information disclosed in this Background section is only for understanding of the background of the inventive concepts, and, therefore, it may contain information that does not constitute prior art.

SUMMARY

Exemplary embodiments of the present invention may be directed to a display device capable of substantially preventing burn defects due to overcurrent by reducing the resistance of wirings connected by contact holes.

Additional features of the inventive concepts will be set forth in the description which follows, and in part will be apparent from the description, or may be learned by practice of the inventive concepts.

According to an exemplary embodiment of the present invention, a display device includes: a first substrate; a first conductive line disposed on the first substrate; an insulating layer disposed on the first conductive line; a second conductive line disposed on the first conductive line and the insulating layer; a protective layer disposed on the second conductive line; a plurality of first contact holes defined by the insulating layer and the protective layer; a plurality of second contact holes defined by the protective layer; and a conductive layer disposed over the plurality of first contact holes and the plurality of second contact holes, and connecting the first conductive line and the second conductive line. The plurality of first contact holes and the plurality of second contact holes are arranged alternately along a first direction and along a second direction which intersects the first direction.

The conductive layer may further include a plurality of first contact portions that contact the first conductive line through the plurality of first contact holes.

The conductive layer may further include a plurality of second contact portions that contact the second conductive line through the plurality of second contact holes.

The plurality of second contact portions may overlap the first conductive line.

The second conductive line may extend along the second direction in a zigzag manner on the first conductive line.

The second conductive line may include a stem portion and a branch portion in an area overlapping the conductive layer, the stem portion extending along the second direction and the branch portion extending from the stem portion along the first direction.

The first conductive line may have at least one first opening area.

The stem portion may overlap the first opening area, and only a part of the branch portion may overlap the first opening area.

The second conductive line may enclose each of the plurality of first contact portions on a plane.

The second conductive line may have a plurality of second opening areas corresponding to the plurality of first contact holes.

According to an exemplary embodiment of the present invention, a display device includes: a first substrate; a gate line disposed on the first substrate; a gate driver connected to the gate line; a clock line for transmitting a clock signal; a gate insulating layer disposed on the gate line and the clock line; a plurality of first contact holes defined by the gate insulating layer; a connection line disposed on the gate line, the clock line, and the gate insulating layer, the connection line connecting the clock line and the gate driver; a protective layer disposed on the connection line; a plurality of second contact holes defined by the protective layer; a conductive layer disposed over the plurality of first contact holes and the plurality of second contact holes and connecting the clock line and the connection line. The plurality of first contact holes and the plurality of second contact holes are arranged alternately along a first direction and along a second direction which intersects the first direction.

The plurality of second contact holes may overlap the clock line.

The connection line may extend along the second direction in a zigzag manner on the clock line.

The connection line may include a stem portion and a branch portion in an area overlapping the conductive layer, the stem portion extending along the second direction and the branch portion extending from the stem portion along the first direction.

The clock line may have at least one first opening area.

The stem portion may overlap the first opening area, and only a part of the branch portion may overlap the first opening area.

The connection line may enclose each of the plurality of first contact portions on a plane.

The connection line may have a plurality of second opening areas corresponding to the plurality of first contact holes.

The clock line may include a first clock line and a second clock line spaced apart from the first clock line by a predetermined pitch. A sum of a width of an area where the first opening area and the second opening area overlap each other and an interval between the first clock line and the second clock line may be substantially equal to or greater than about 30% of the pitch.

The display device may further include: a second substrate opposing the first substrate; and a sealing member disposed between the clock line and the second substrate. The sealing member may have a width substantially equal to or greater than about 1.0 mm and substantially equal to or less than about 3.5 mm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
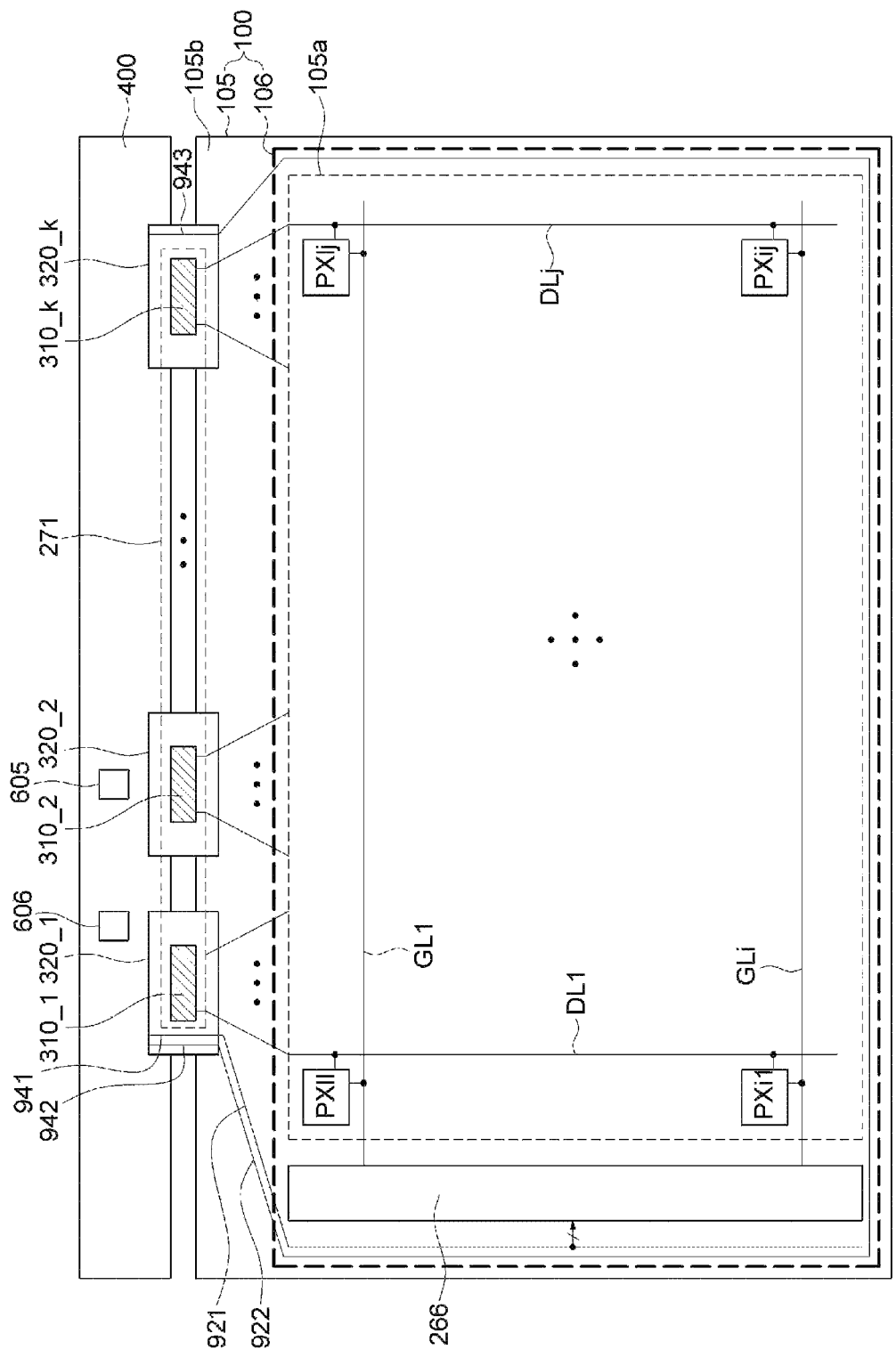
FIG. 1 is a view illustrating a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment of the present invention will be described with reference to FIGS. 1 to 9.

FIG. 1 is a view illustrating a display device according to an exemplary embodiment of the present invention.

As illustrated in FIG. 1, a display device 500 according to an exemplary embodiment of the present invention includes a display panel 100, a data driver 271, a gate driver 266, a circuit board 400, a timing controller 606, and a power supply 605.

The display panel 100 includes a first panel 105 and a second panel 106. The first panel 105 and the second panel 106 face each other. The first panel 105 includes a display area 105a and a non-display area 105b.

The display panel 100 may be a panel used in various types of display devices, e.g., a liquid crystal display ("LCD") panel or an organic light emitting diode ("OLED") display panel. When the display panel 100 is an LCD panel, a liquid crystal layer may be disposed between the first panel 105 and the second panel 106. When the display panel 100 is an OLED display panel, an organic light emitting layer may be disposed between the first panel 105 and the second panel 106.

The first panel 105 includes a plurality of gate lines GL1 to GLi, a plurality of data lines DL1 to DLj, a common line 922, and a plurality of pixels PX11 to PXij. The gate lines GL1 to GLi, the data lines DL1 to DLj, and the pixels PX11 to PXij are located on a first substrate 401 (see FIG. 4) of the first panel 105.

The second panel 106 includes a light blocking layer which defines a pixel area. In an embodiment, the light blocking layer may be located on the first panel 105. The light blocking layer substantially prevents unwanted light emission from areas other than the pixel area.

The data lines DL1 to DLj cross the gate lines GL1 to GLi. The data lines DL1 to DLj extend to the non-display area 105b to be connected to the data driver 271.

The data driver 271 includes a plurality of data driving integrated circuits ("ICs") 310_1, 310_2, . . . , and 310_k. The data driving ICs 310_1, 310_2, . . . , and 310_k receive digital image data signals and a data control signal applied from the timing controller 606. The data driving ICs 310_1, 310_2, . . . , and 310_k sample the digital image data signals according to the data control signal, latch the sampled digital image data signals corresponding to one horizontal line in each horizontal period, and apply the latched image data signals to the data lines DL1 to DLj. That is, the data driving ICs 310_1, 310_2, . . . , and 310_k may convert the digital image data signals applied from the timing controller 606 into analog image signals using a gamma voltage input from the power supply 605 and may apply the converted analog image signals to the data lines DL1 to DLj.

The data driving ICs 310_1, 310_2, . . . , and 310_k are mounted on data carriers 320_1, 320_2, . . . , and 320_k, respectively. The data carriers 320_1, 320_2, . . . , and 320_k are connected between the circuit board 400 and the first panel 105. For example, each of the data carriers 320_1, 320_2, . . . , and 320_k may be electrically connected between the circuit board 400 and the non-display area 105b of the first panel 105.

The timing controller 606 and the power supply 605 described above may be disposed on the circuit board 400.

The data carriers 320_1, 320_2, . . . , and 320_k include input lines for transmitting various signals applied from the timing controller 606 and the power supply 605 to the data driving ICs 310_1, 310_2, . . . , and 310_k and output lines for transmitting the image data signals output from the data driving ICs 310_1, 310_2, . . . , and 310_k to the corresponding ones of the data lines DL1 to DLj.

A data carrier at a leftmost edge, e.g., the data carrier 320_1, may include a first auxiliary line 941 and a second auxiliary line 942 for transmitting various signals and a common voltage applied from the timing controller 606 and the power supply 605 to the first panel 105.

A data carrier at a rightmost edge, e.g., the data carrier 320_k, may include a third auxiliary line 943 for transmitting the common voltage applied from the power supply 605 to the first panel 105.

The first auxiliary line 941 is connected to a gate control line 921 of the first panel 105. The gate control line 921 transmits various signals applied through the first auxiliary line 941 to the gate driver 266.

The common line 922 transmits the common voltage applied through the second and third auxiliary lines 942 and 943 to a common electrode of the second panel 106. The common line 922 may have a shape to enclose three surfaces of the display area 105a. The common electrode of the second panel 106 is connected to the common line 922 of the first panel 105 through a short-circuit portion (not illustrated). The common electrode receives the common voltage from the common line 922 through the short-circuit portion.

The gate control line 921 and the common line 922 may be formed on the non-display area 105b of the first panel 105 in a line-on-glass structure.

The pixels PX11 to PXij are arranged in a matrix in the display area 105a of the first panel 105. The pixels PX11 to PXij include red pixels for displaying red images, green pixels for displaying green images, and blue pixels for displaying blue images. In such an exemplary embodiment, the red pixel, the green pixel, and the blue pixel that are adjacent to one another in the horizontal direction may define a unit pixel for displaying one unit image.

There are a "j" number of pixels arranged along a p-th (p being one selected from 1 to i) horizontal line (hereinafter, p-th horizontal line pixels), which are connected to the first to j-th data lines DL1 to DLj, respectively. In addition, the p-th horizontal line pixels are connected to the p-th gate line in common. Accordingly, the p-th horizontal line pixels receive a p-th gate signal as a common signal. That is, the "j" number of pixels disposed in the same horizontal line receive the same gate signal, while pixels disposed in different horizontal lines receive different gate signals from one another.

Each of the pixels includes a pixel transistor, a liquid crystal capacitor, and a storage capacitor, although not illustrated. The pixel transistor may be a thin film transistor, for example.

The pixel transistor is turned on according to the gate signal applied from the gate line. The turned-on pixel transistor applies the analog image data signals applied from the data line to the liquid crystal capacitor and the storage capacitor.

The liquid crystal capacitor includes a pixel electrode and a common electrode which oppose each other.

The storage capacitor includes a pixel electrode and an opposing electrode which oppose each other. Herein, the opposing electrode may be a previous gate line or a transmission line for transmitting the common voltage.

The gate lines GL1 to GLi are driven by the gate driver 266, and the gate driver 266 includes a shift register.

Figure 2:
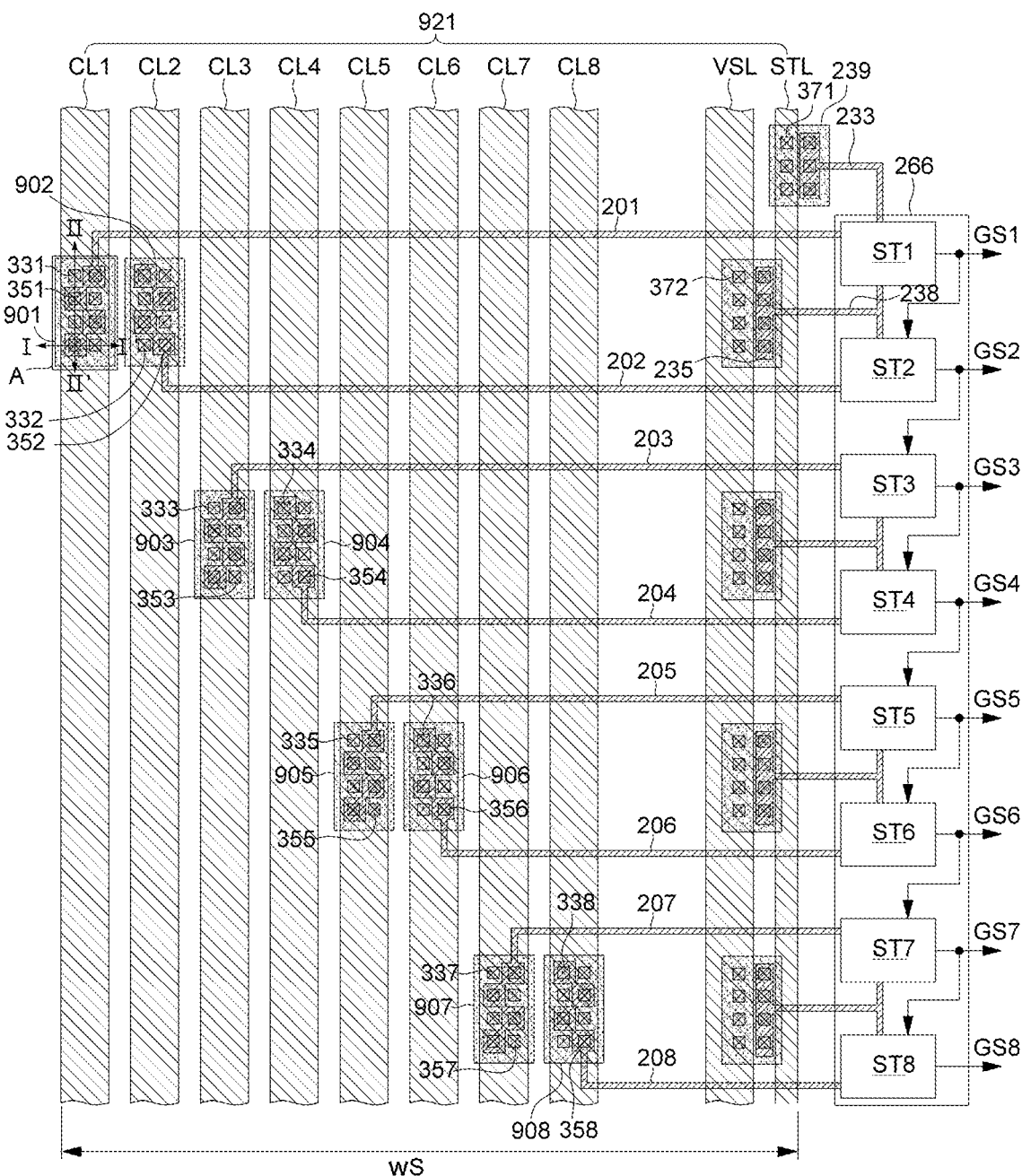
FIG. 2 is a view illustrating the connection relationship between a gate control line and a gate driver of FIG. 1.
Figure 3:
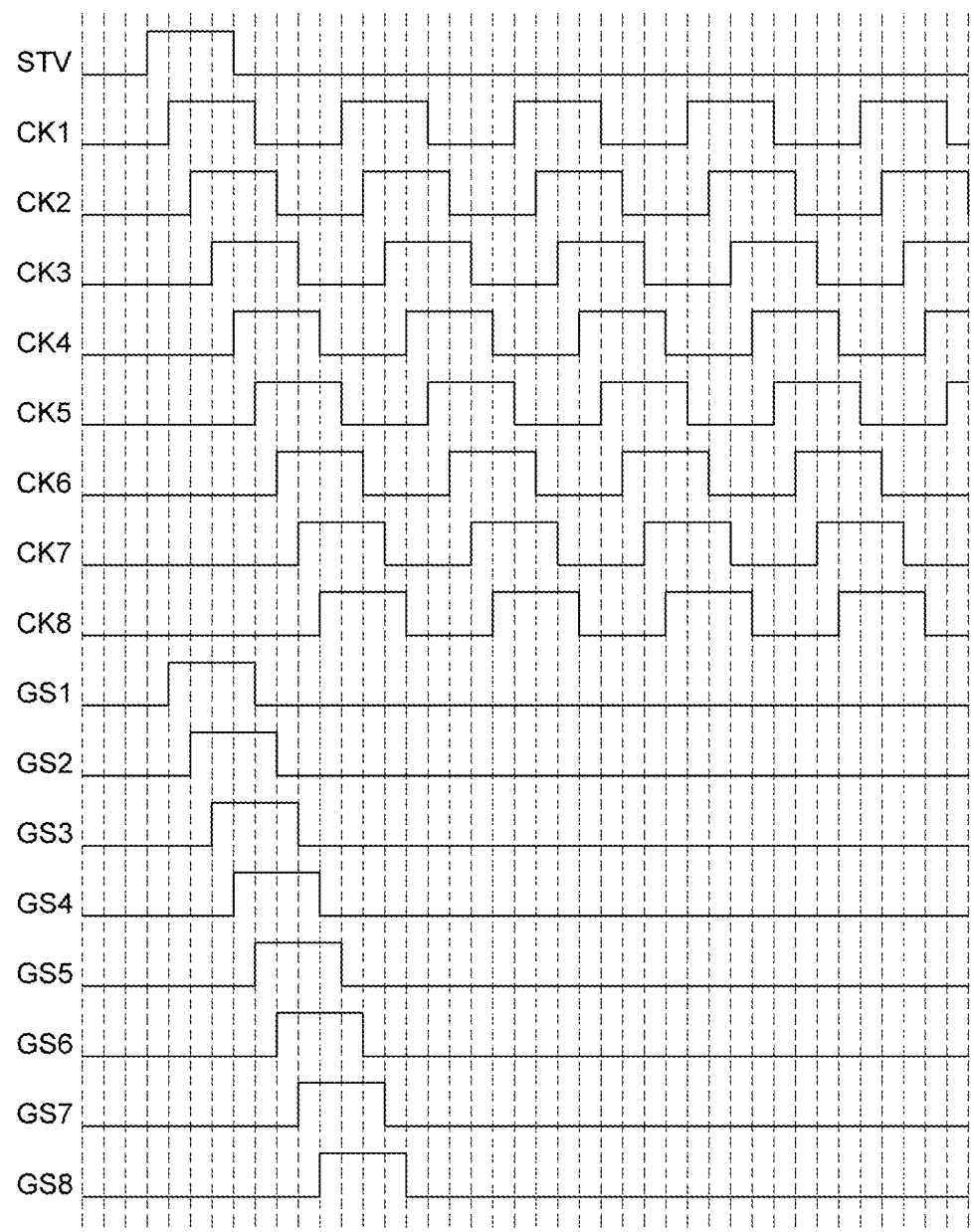
FIG. 3 is a timing diagram showing waveforms of various signals applied to the gate control line of FIG. 2 and gate signals output from the gate driver of FIG. 2.

FIG. 2 is a view illustrating the connection relationship between the gate control line and the gate driver of FIG. 1, and a part of the gate control line and a part of the gate driver are shown in FIG. 2. FIG. 3 is a timing diagram showing waveforms of various signals applied to the gate control line of FIG. 2 and gate signals output from the gate driver of FIG. 2.

As illustrated in FIG. 2, the gate control line 921 includes a first clock line CL1, a second clock line CL2, a third clock line CL3, a fourth clock line CL4, a fifth clock line CL5, a sixth clock line CL6, a seventh clock line CL7, an eighth clock line CL8, a base line VSL and a start line STL. However, the inventive concepts are not limited thereto, and the gate control line 921 may include a plurality of clock lines.

As illustrated in FIG. 3, the first, second, third, fourth, fifth, sixth, seventh and eighth clock lines CL1, CL2, CL3, CL4, CL5, CL6, CL7 and CL8 transmit first, second, third, fourth, fifth, sixth, seventh and eighth clock signals CK1, CK2, CK3, CK4, CK5, CK6, CK7 and CK8, respectively, and the start line STL transmits a start vertical signal STV. The first, second, third, fourth, fifth, sixth, seventh, and eighth clock signals CK1, CK2, CK3, CK4, CK5, CK6, CK7 and CK8 and the start vertical signal STV are applied from the timing controller 606. A high voltage of each of the first, second, third, fourth, fifth, sixth, seventh and eighth clock signals CK1, CK2, CK3, CK4, CK5, CK6, CK7 and CK8 corresponds to a high voltage of the gate signal.

As illustrated in FIG. 3, the first, second, third, fourth, fifth, sixth, seventh and eighth clock signals CK1, CK2, CK3, CK4, CK5, CK6, CK7, and CK8 are output sequentially, and are output recursively. That is, the first, second, third, fourth, fifth, sixth, seventh and eighth clock signals CK1, CK2, CK3, CK4, CK5, CK6, CK7, and CK8 are output sequentially from the first clock signal CK1 to the eighth clock signal CK8, and output sequentially from the first clock signal CK1 to the eighth clock signal CK8 once again.

High periods of the clock signals that are output in adjacent periods may overlap each other. For example, as illustrated in FIG. 3, a period corresponding to the latter three fourths of the pulse width of the first clock signal CK1 and a period corresponding to former three fourths of the pulse width of the second clock signal CK2 overlap each other in time.

As illustrated in FIG. 3, the fifth, sixth, seventh, and eighth clock signals CK5, CK6, CK7, and CK8 have phases that are inverted, i.e., shifted by 180 degrees, with respect to the first, second, third, and fourth clock signals CK1, CK2, CK3, and CK4, respectively. For example, the fifth clock signal CK5 has a phase that is inverted, i.e., shifted by 180 degrees, with respect to that of the first clock signal CK1, the sixth clock signal CK6 has a phase that is inverted, i.e., shifted by 180 degrees, with respect to that of the second clock signal CK2, the seventh clock signal CK7 has a phase that is inverted, i.e., shifted by 180 degrees, with respect to that of the third clock signal CK3, and the eighth clock signal CK8 has a phase that is inverted, i.e., shifted by 180 degrees, with respect to that of the fourth clock signal CK4.

While each of the first, second, third, fourth, fifth, sixth, seventh, and eighth clock signals CK1, CK2, CK3, CK4, CK5, CK6, CK7, and CK8 is output a plurality of times in a single frame period, the start vertical signal STV is output only once in a single frame period. In other words, while each of the first, second, third, fourth, fifth, sixth, seventh, and eighth clock signals CK1, CK2, CK3, CK4, CK5, CK6, CK7, and CK8 has an active state (high voltage) a plurality of times periodically in a single frame, the start vertical signal STV has an active state (high voltage) only once in a single frame period.

The gate driver 266, as illustrated in FIG. 1, is located in the non-display area 105b of the first panel 105. The gate driver 266 includes a shift register. The shift register includes a plurality of stages ST1, ST2, ST3, ST4, ST5, ST6, ST7, and ST8.

Each of the stages ST1, ST2, ST3, ST4, ST5, ST6, ST7, and ST8 receives one of the first, second, third, fourth, fifth, sixth, seventh and eighth clock signals CK1, CK2, CK3, CK4, CK5, CK6, CK7, and CK8 to thereby generate first, second, third, fourth, fifth, sixth, seventh, and eighth gate signals GS1, GS2, GS3, GS4, GS5, GS6, GS7, and GS8. An $8m+1^{th}$ stage (e.g., a stage ST1) receives the first clock signal CK1 to thereby generate a first gate signal GS1, an $8m+2^{th}$ stage (e.g., a stage ST2) receives the second clock signal CK2 to thereby generate a second gate signal GS2, an $8m+3^{th}$ stage (e.g., a stage ST3) receives the third clock signal CK3 to thereby generate a third gate signal GS3, an $8m+4^{th}$ stage (e.g., a stage ST4) receives the fourth clock signal CK4 to thereby generate a fourth gate signal GS4, an $8m+5^{th}$ stage (e.g., a stage ST5) receives the fifth clock signal CK5 to thereby generate a fifth gate signal GS5, an $8m+6^{th}$ stage (e.g., a stage ST6) receives the sixth clock signal CK6 to thereby generate a sixth gate signal GS6, an $8m+7^{th}$ stage (e.g., a stage ST7) receives the seventh clock signal CK7 to thereby generate a seventh gate signal GS7 and an $8m+8^{th}$ stage (e.g., a stage ST8) receives the eighth clock signal CK8 to thereby generate an eighth gate signal GS8, where "m" is a natural number and includes 0.

Each of the stages ST1, ST2, ST3, ST4, ST5, ST6, ST7, and ST8 receives the gate signal applied from a previous stage as an initiating signal and is, thereby, set. The stage that is set outputs, as a gate signal, the clock signal that is applied to the corresponding stage that is set. For example, the second stage ST2 receives the first gate signal GS1 from the first stage ST1 as an initiating signal and is set. The second stage ST2 that is set receives the second clock signal CK2 and outputs the second gate signal GS2.

In an exemplary embodiment, although not illustrated, each of the stages ST1, ST2, ST3, ST4, ST5, ST6, ST7, and ST8 receives the gate signal applied from a succeeding stage and is, thereby, reset.

The first stage ST1, which is driven firstly in each frame period, receives the start vertical signal STV as an initiating signal. In addition, although not illustrated, a stage that is driven lastly in each frame period also receives the start vertical signal STV. The stage that is driven lastly in each frame period receives the start vertical signal STV and thereby is reset.

As described above, the gate driver 266 may receive clock signals of eight phases, e.g., the first, second, third, fourth, fifth, sixth, seventh, and eighth clock signals CK1, CK2, CK3, CK4, CK5, CK6, CK7, and CK8, but the number of phases of the clock signal is not limited thereto. That is, the gate driver 266 may receive clock signals of "q" number of phases, where "q" is a natural number greater than 1.

Referring to FIG. 2, the first clock line CL1 is connected to the gate driver 266 through a first connection line 201. For example, the first connection line 201 connects the first clock line CL1 and the first stage ST1 of the gate driver 266 to each other.

The first clock line CL1 and the first connection line 201, each being a conductive line, may include a metal material such as copper (Cu), silver (Ag), gold (Au), or aluminum (Al).

Figure 4:
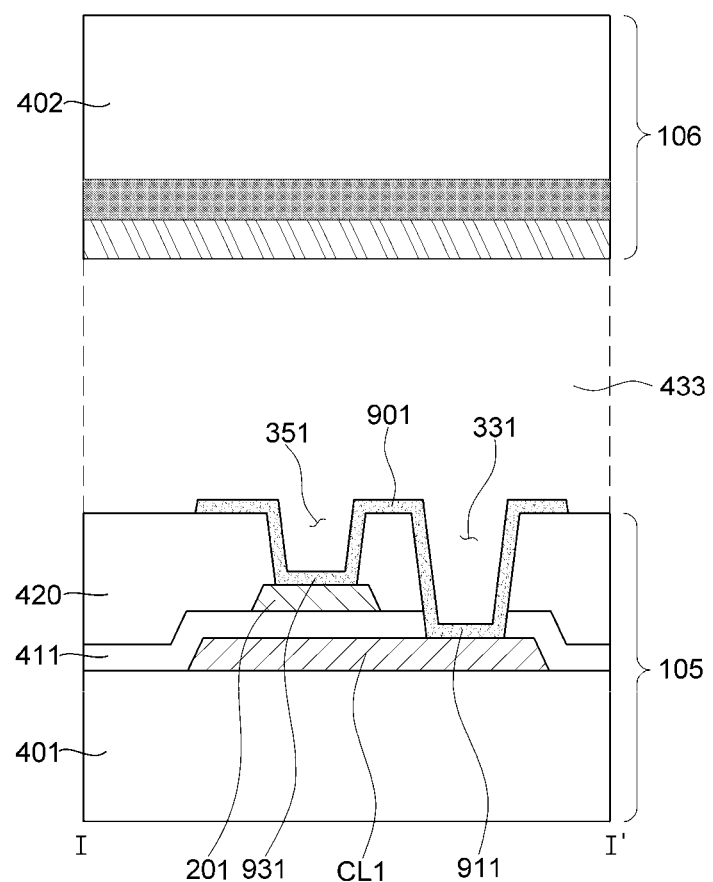
FIG. 4 is a cross-sectional view taken along line I-I' in FIG. 2.
Figure 5:
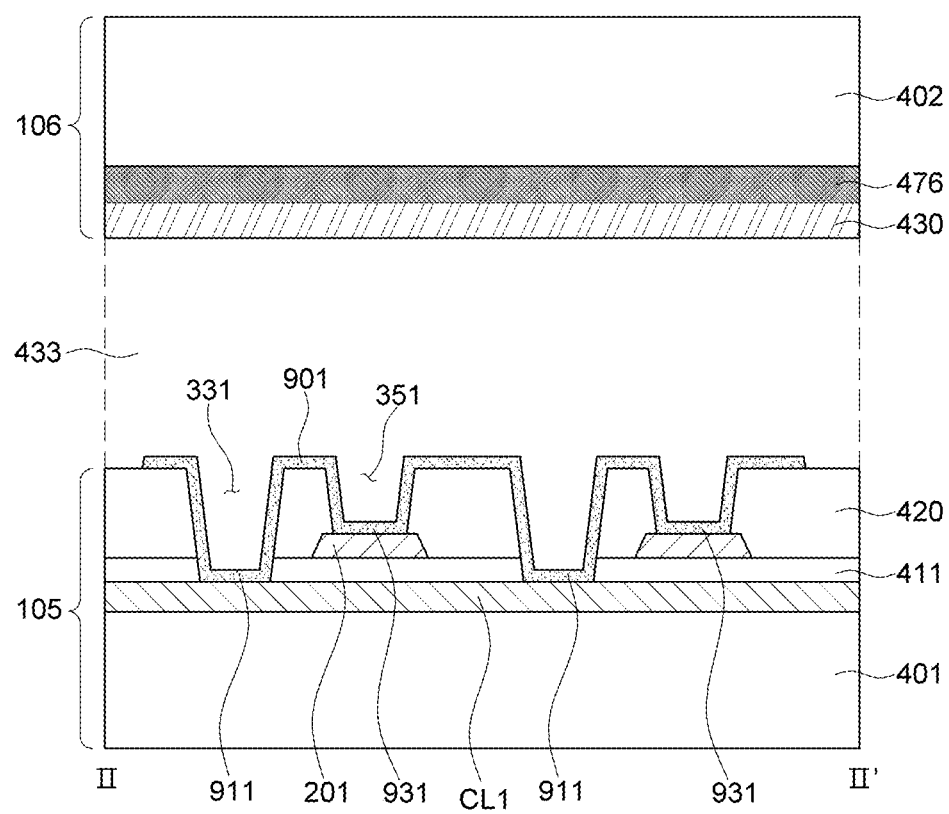
FIG. 5 is a cross-sectional view taken along line II-II' in FIG. 2.

FIG. 4 is a cross-sectional view taken along line I-I' in FIG. 2, and FIG. 5 is a cross-sectional view taken along line in FIG. 2.

As illustrated in FIG. 4, the first clock line CL1 and the first connection line 201 are located on different layers. The first clock line CL1 and the first connection line 201 are connected to each other by a first conductive layer 901. A portion of the first conductive layer 901 is connected to the first clock line CL1 through a plurality of first contact holes 331, and another portion of the first conductive layer 901 is connected to the first connection line 201 through a plurality of second contact holes 351. The first contact hole 331 passes through a gate insulating layer 411 and a protective layer 420, and is defined by the gate insulating layer 411 and the protective layer 420. The first clock line CL1 is exposed by the first contact hole 331. The second contact hole 351 passes through the protective layer 420, and is defined by the protective layer 420. The first connection line 201 is exposed by the second contact hole 351. In such an exemplary embodiment, the first conductive layer 901 includes a first contact portion 911 contacting the first clock line CL1 through the first contact hole 331 and a second contact portion 931 contacting the first connection line 201 through the second contact hole 351.

The first connection line 201 overlaps the first clock line CL1. Specifically, the first connection line 201 overlaps the first clock line CL1 with the gate insulating layer 411 therebetween. Accordingly, the second contact hole 351 that exposes the first connection line 201 is disposed above the first clock line CL1, and the second contact portion 931 that contacts the first connection line 201 overlaps the first clock line CL1.

A liquid crystal layer, although not illustrated, may be disposed between the first substrate 401 and the second substrate 402.

According to an exemplary embodiment of the present invention, a sealing member 433 may be disposed between the first clock line CL1 and the second substrate 402. Specifically, as illustrated in FIGS. 2 and 4, the sealing member 433 may be disposed between the first clock line CL1 and the second substrate 402. Accordingly, the display device according to an exemplary embodiment of the present invention may reduce the width of a bezel. The sealing member 433 may have a width wS which is substantially equal to or more than about 1.0 mm and substantially equal to or less than about 3.5 mm. In the case where the sealing member 433 has a width of about 1.0 mm or less, only part of the plurality of clock lines may be disposed below the sealing member 433. Accordingly, the magnitude of the load over each of the plurality of clock lines varies, and thus, the electrical characteristics of each clock line may be changed. In the case where the sealing member 433 has a width of about 3.5 mm or more, the width of the bezel may increase.

Figure 6:
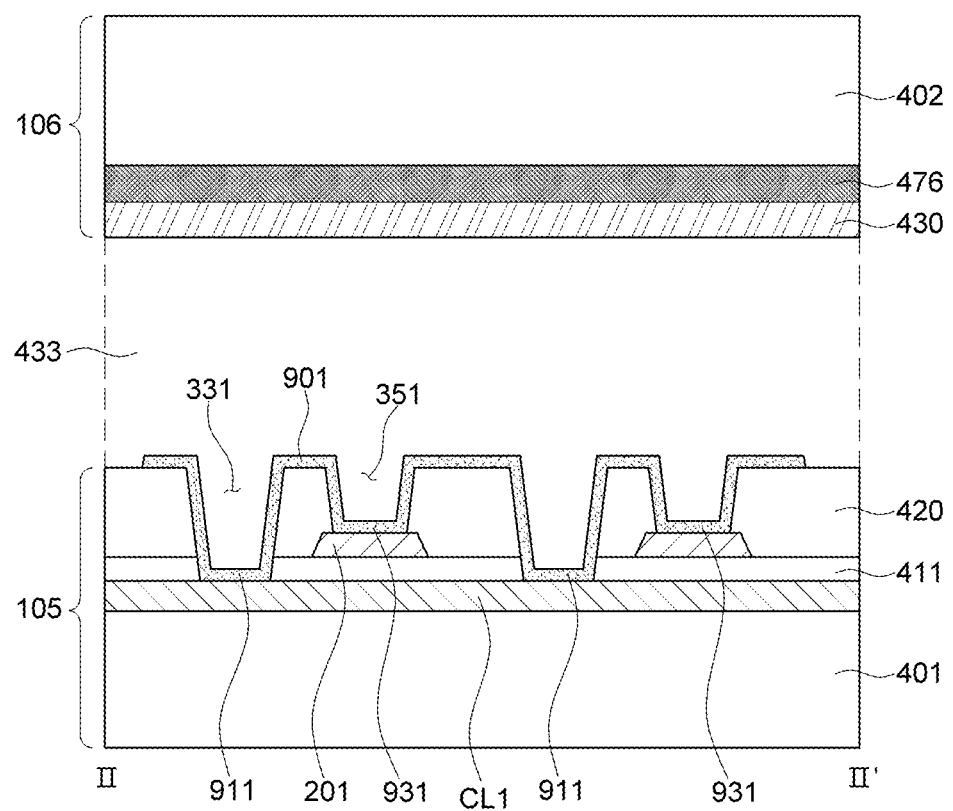
FIG. 6 is an enlarged view illustrating portion A of FIG. 2.
Figure 7:
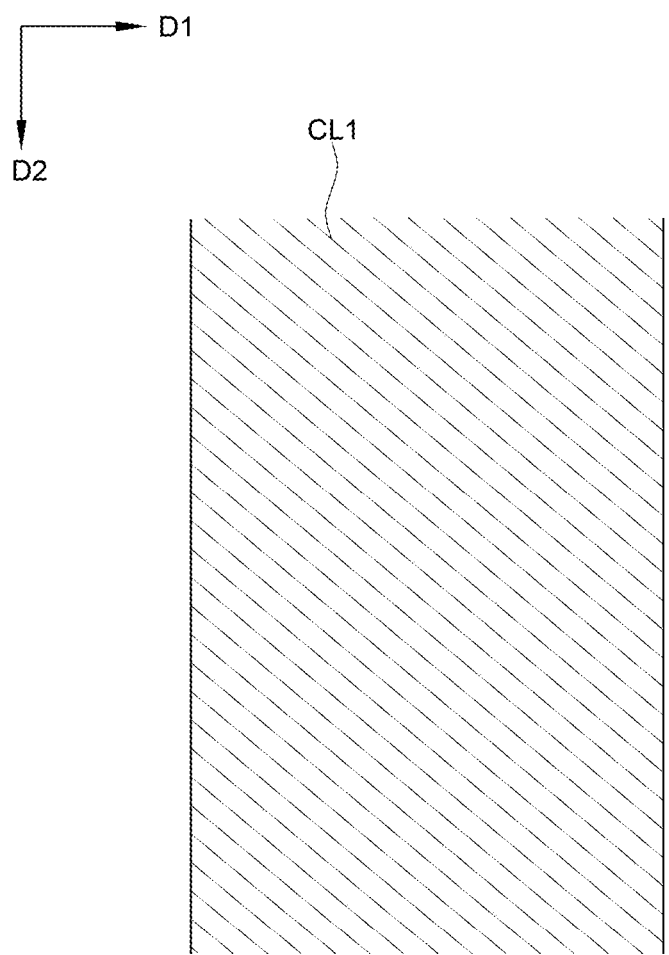
FIG. 7 is a plan view illustrating a clock wiring of portion A in FIG. 2.
Figure 8:
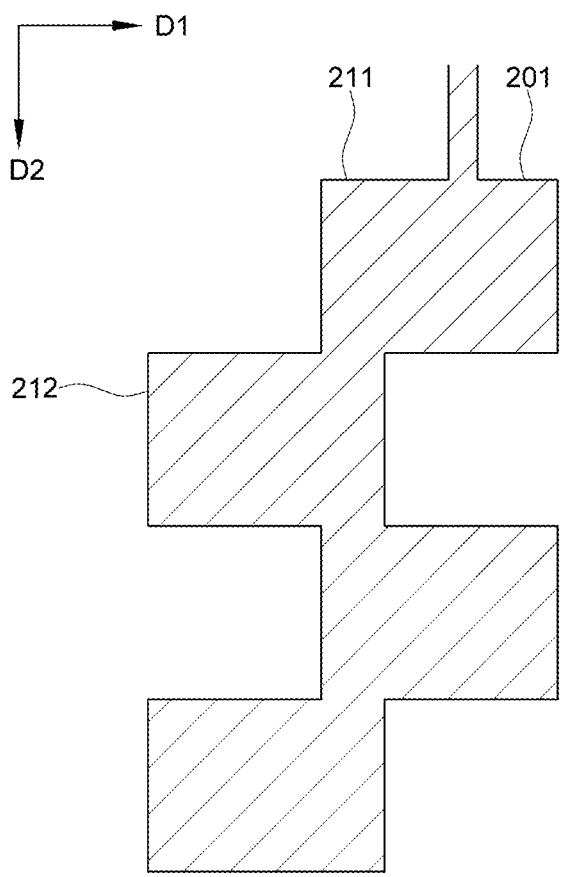
FIG. 8 is a plan view illustrating a connection line of portion A in FIG. 2.
Figure 9:
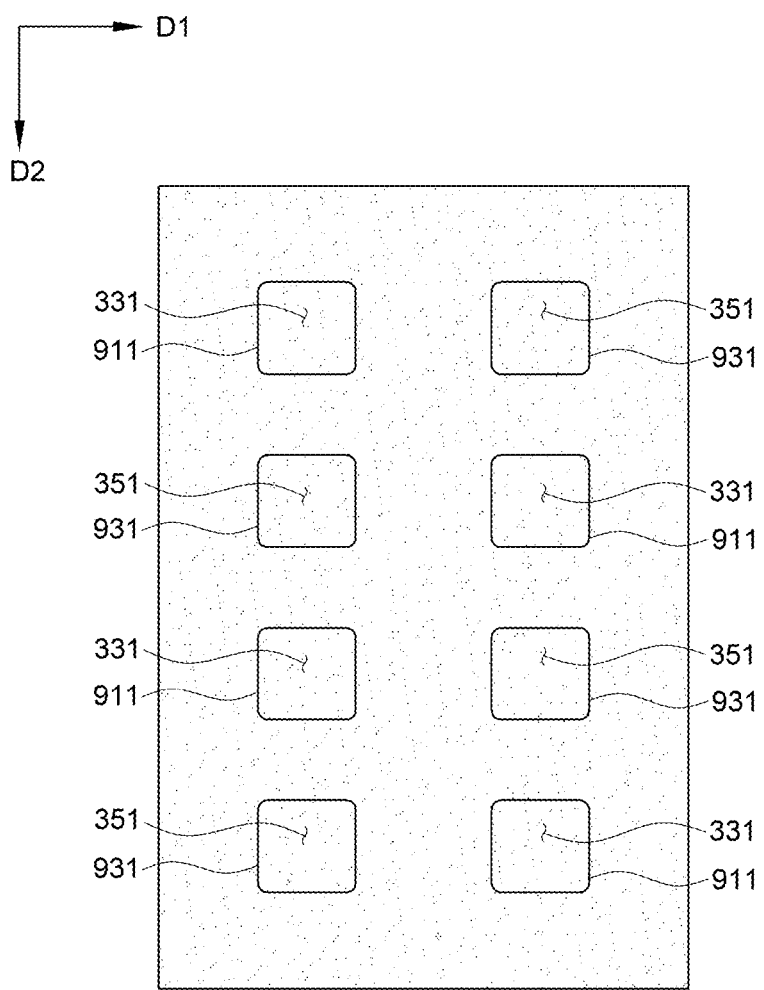
FIG. 9 is a plan view illustrating a first contact hole and a second contact hole in portion A of FIG. 2.

FIG. 6 is an enlarged view illustrating portion A of FIG. 2, and FIG. 7 is a plan view illustrating a clock wiring of portion A in FIG. 2. FIG. 8 is a plan view illustrating a connection line of portion A in FIG. 2, and FIG. 9 is a plan view illustrating a first contact hole and a second contact hole in portion A of FIG. 2. The description of the display device according to an exemplary embodiment of the present invention will be omitted from the description related to the display device according to another exemplary embodiment of the present invention.

Referring to FIGS. 2, 6 and 7, the first clock line CL1 has a plate shape extending along the second direction D2.

Referring to FIGS. 6 to 8, the first connection line 201 includes a stem portion 211 and a branch portion 212 in an area overlapping the first conductive layer 901. The stem portion 211 extends rectilinearly along the second direction D2, and the branch portion 211 extends from the stem portion 211 along the first direction D1. Specifically, the branch portions 212 extending from the stem portion 211 are arranged in a horizontally alternating manner (e.g., one to the left side and the neighboring one to the right side) with respect to the stem portion 211. Accordingly, the first connection line 201 extends in the second direction D2 in a zigzag form on a plane on the first clock line CL1.

According to an exemplary embodiment of the present invention, the plurality of first contact holes 331 and the plurality of second contact holes 351 may be alternately arranged along the first direction D1, and may be alternately arranged along the second direction D2 that intersects the first direction D1. Accordingly, the first contact portion 911 contacting the first clock line CL1 through the first contact hole 331 and the second contact portion 931 contacting the first connection line 201 through the second contact hole 351 may be alternately arranged along the first direction D1, and may be alternately arranged along the second direction D2 that intersects the first direction D1.

According to an exemplary embodiment of the present invention, the first contact portion 911 and the second contact portion 931 may be disposed adjacent to each other in an alternating manner along the first direction D1 and the second direction D2. Accordingly, the number of current paths from the first contact portion 911 to the second contact portion 931 that is close to the first contact portion 911 increases, and the resistance between the first contact portion 911 and the second contact portion 931 may be reduced. Accordingly, overcurrent of the wirings between the first contact portion 911 and the second contact portion 931 may be substantially prevented, and the wirings may not be overheated and burned.

Hereinafter, a display device according to another exemplary embodiment of the present invention will be described with reference to FIGS. 10 and 11. The description of the display device according to an exemplary embodiment of the present invention will be omitted from the description related to the display device according to another exemplary embodiment of the present invention.

Figure 10:
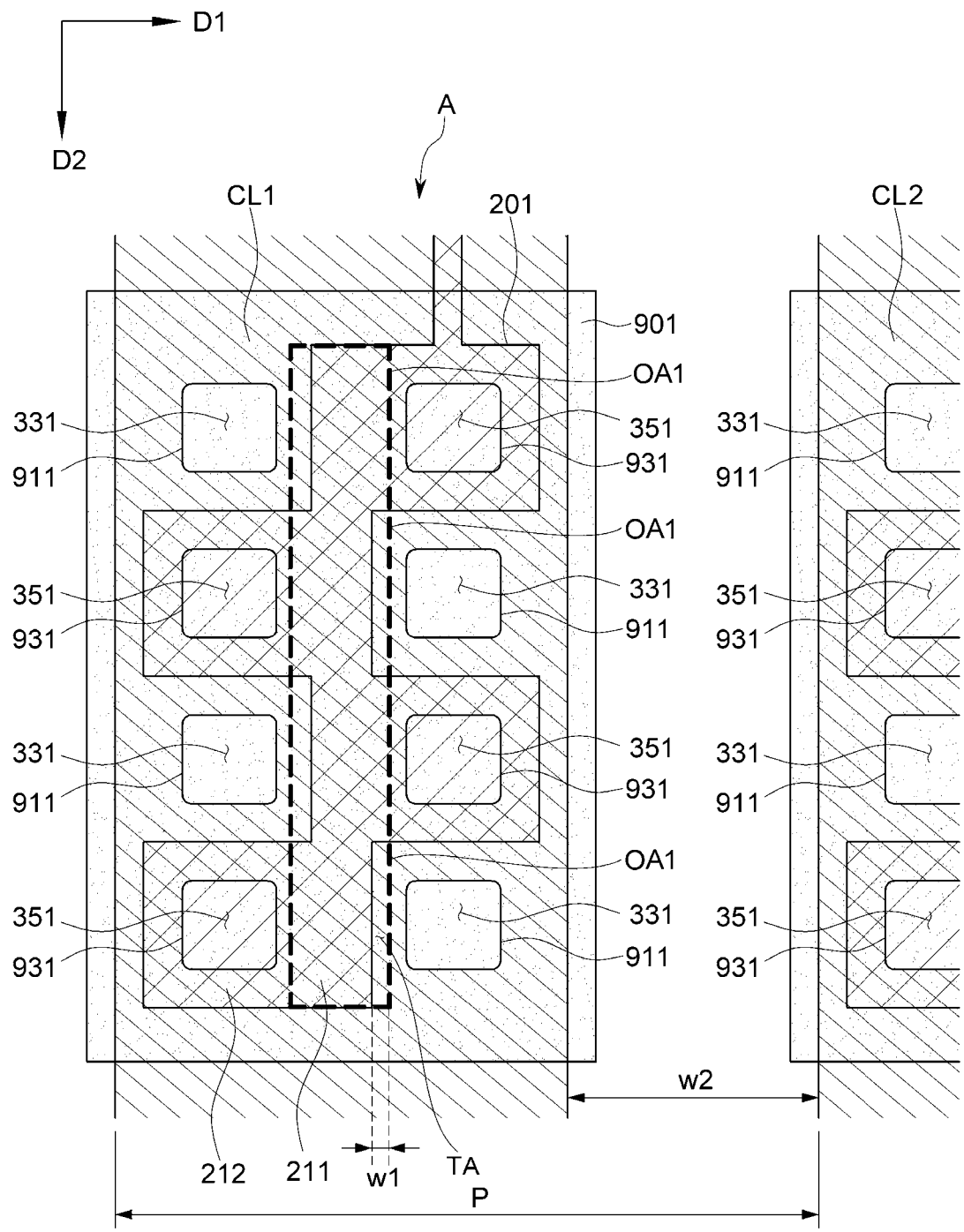
FIG. 10 is an enlarged view illustrating a clock wiring according to another exemplary embodiment of the present invention.
Figure 11:
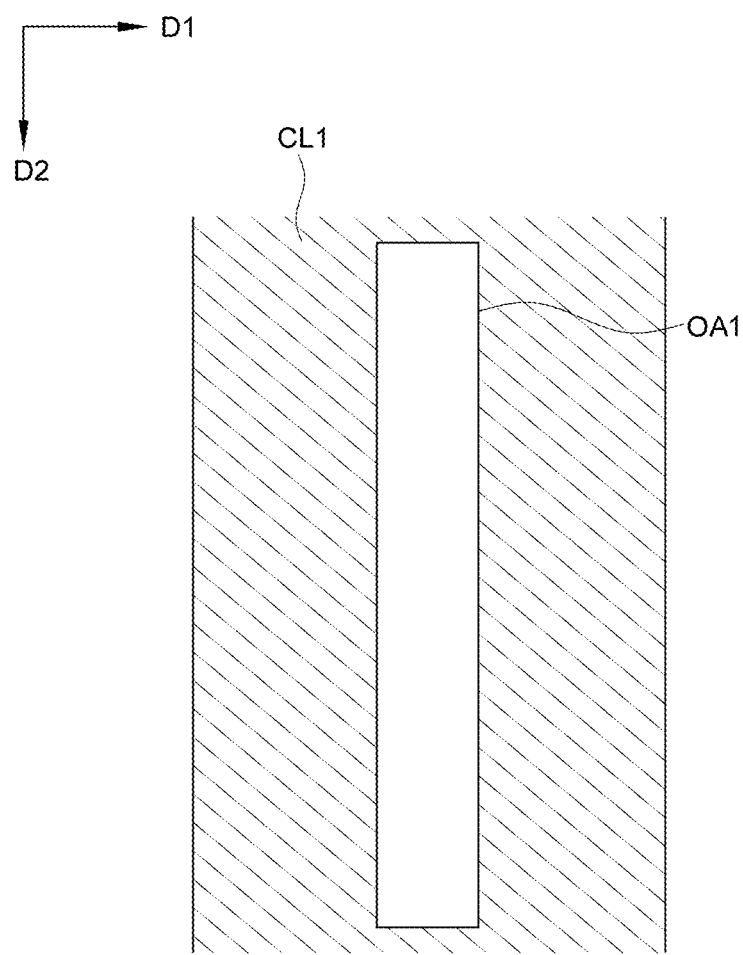
FIG. 11 is a plan view illustrating the clock wiring according to another exemplary embodiment of the present invention.

FIG. 10 is an enlarged view illustrating a clock wiring according to another exemplary embodiment of the present invention, and FIG. 11 is a plan view illustrating the clock wiring according to another exemplary embodiment of the present invention.

As illustrated in FIG. 10, a second clock line CL2 may be spaced apart from a first clock line CL1 by a predetermined pitch P along the first direction D1.

According to another exemplary embodiment of the present invention, a first opening area OA1 may overlap a stem portion 211 of a first connection line 201, and may overlap a portion of a branch portion 212 of the first connection line 201. In other words, a part of the first opening area OA1 may not overlap the first connection line 201. When an area where the first opening area OA1 and an area not disposed with the first connection line 201 overlap each other is defined as a light transmission area TA, the light transmission area TA in which the first opening area OA1 overlaps an area not disposed with the first connection line 201 may be defined by the first clock line CL1 and the first connection line 201.

According to another exemplary embodiment of the present invention, the sum of a width w1 of the light transmission area TA and a distance w2 between the first clock line CL1 and the second clock line CL2 is substantially equal to or more than about 30% of one pitch P.

Accordingly, UV light may be applied in the direction from a first substrate 401 to a second substrate 402 through the light transmission area TA in the display device, and thus, a sealing member 433 disposed on the first clock line CL1 and the second clock line CL2 may be cured. In such an embodiment, in the case where the sum of the width w1 of the light transmission area TA and the distance w2 between the first clock line CL1 and the second clock line CL2 is less than about 30%, the amount of UV light for curing the sealing member 433 may be insufficient.

Hereinafter, a display device according to still another exemplary embodiment of the present invention will be described with reference to FIGS. 12 and 13. The description of the display device according to another exemplary embodiment of the present invention will be omitted from the description related to the display device according to still another exemplary embodiment of the present invention.

Figure 12:
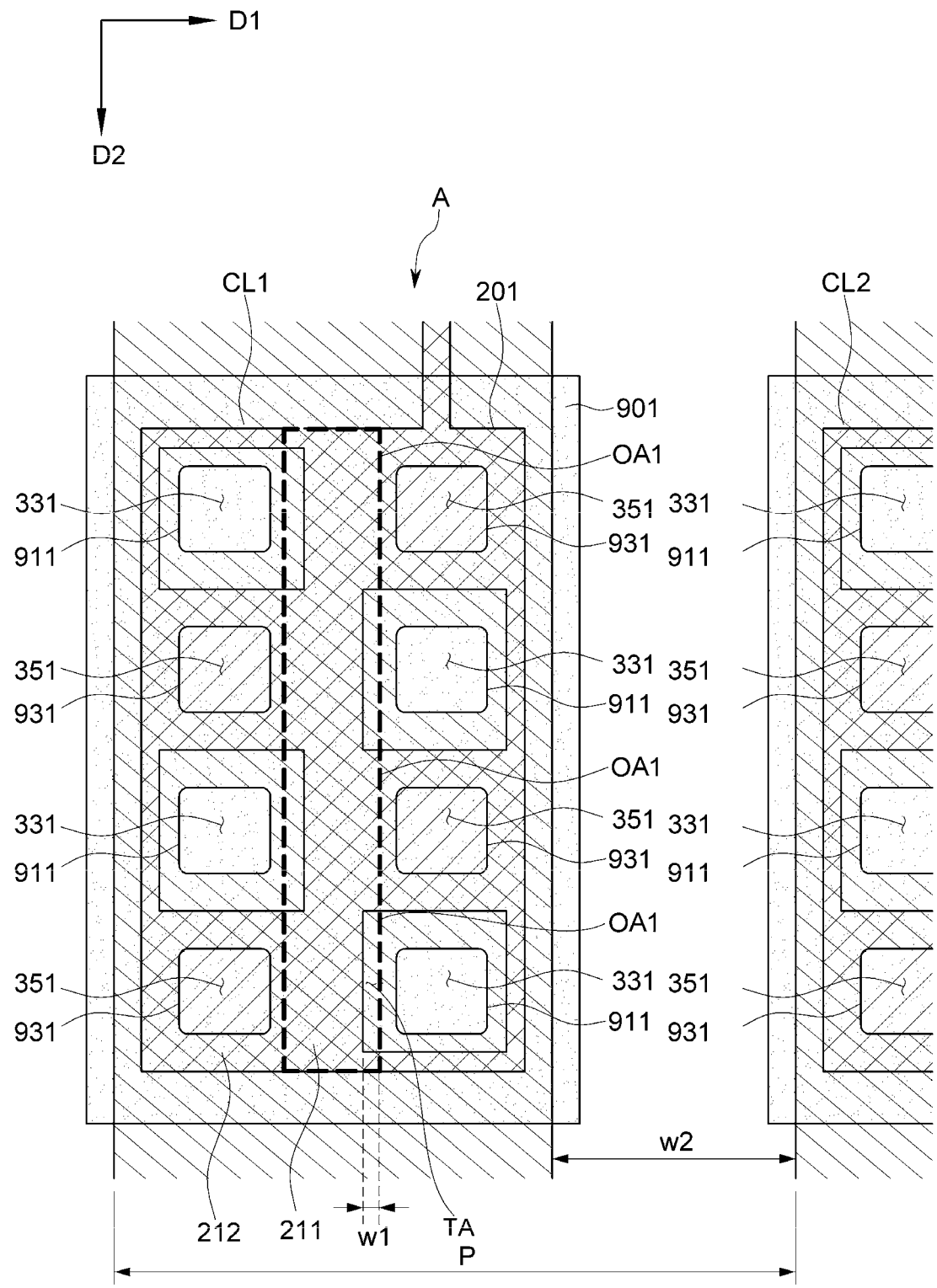
FIG. 12 is an enlarged view illustrating a clock wiring according to still another exemplary embodiment of the present invention.
Figure 13:
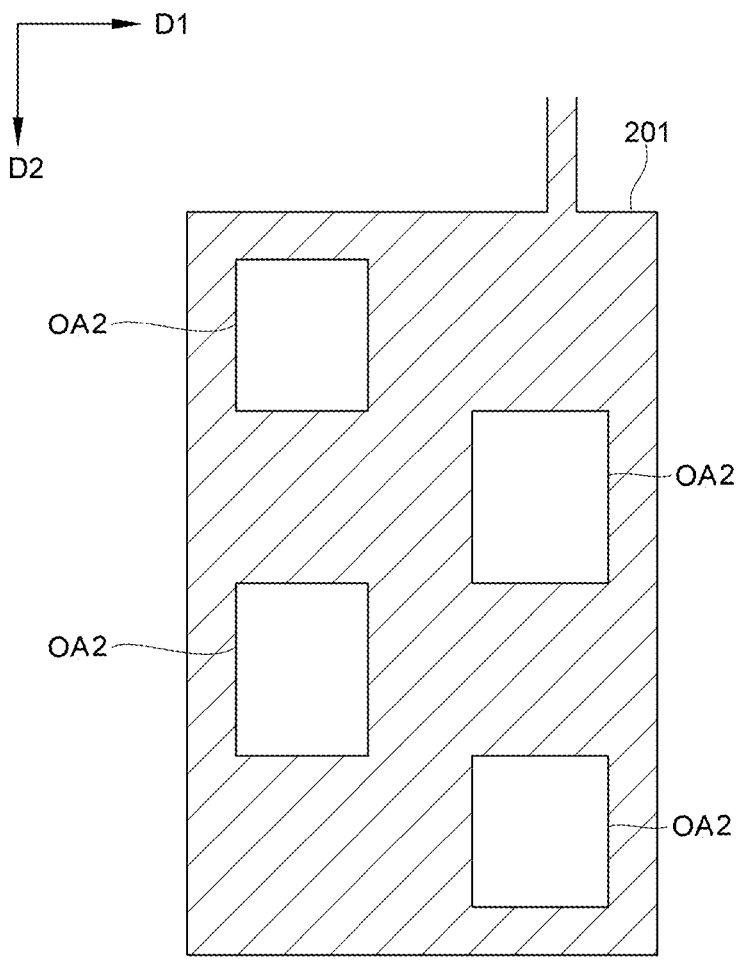
FIG. 13 is a plan view illustrating a connection line according to still another exemplary embodiment of the present invention.

FIG. 12 is an enlarged view illustrating a clock wiring according to still another exemplary embodiment of the present invention, and FIG. 13 is a plan view illustrating a connection line according to still another exemplary embodiment of the present invention.

As illustrated in FIG. 12, a second clock line CL2 may be spaced apart from a first clock line CL1 by a predetermined pitch P along the first direction D1.

As illustrated in FIG. 12, the first clock line CL1 has at least one first opening area OA1.

As illustrated in FIG. 13, a first connection line 201 has a plate shape having a plurality of second opening areas OA2 located corresponding to a plurality of first contact holes 331. The plurality of second opening areas OA2 may be arranged in a zigzag manner. The plurality of second opening areas OA2 overlap a plurality of first contact portions 911, respectively. The first connection line 201 may have a shape that encloses the first contact hole 331 and the first contact portion 911 on a plane.

According to still another exemplary embodiment of the present invention, a first opening area OA1 may overlap a stem portion 211 of the first connection line 201, and may overlap a portion of a branch portion 212 of the first connection line 201. In other words, part of the first opening area OA1 may not overlap the first connection line 201, and at least part of the first opening area OA1 may overlap the second opening area OA2. When an area where the first opening area OA1 and the second opening area OA2 overlap each other is defined as a light transmission area TA, the light transmission area TA in which the first opening area OA1 overlaps the second opening area OA2 may be defined by the first clock line CL1 and the first connection line 201. According to still another exemplary embodiment of the present invention, the sum of a width w1 of the light transmission area TA and a distance w2 between the first clock line CL1 and the second clock line CL2 is substantially equal to or more than about 30% of one pitch P.

Accordingly, UV light may be applied in the direction from a first substrate 401 to a second substrate 402 through the light transmission area TA in the display device, and thus a sealing member 433 disposed on the first clock line CL1 and the second clock line CL2 may be cured. In such an exemplary embodiment, in the case where the sum of the width w1 of the light transmission area TA and the distance w2 between the first clock line CL1 and the second clock line CL2 is less than about 30%, the amount of UV light for curing the sealing member 433 may be insufficient.

Although the above-described exemplary embodiments of the present invention is have been described with respect to the structure applied to the clock lines, exemplary embodiments of the present invention are not limited thereto, and may be applied to the structure in which conductive lines on different layers are connected to conductive layers through contact holes.

As set forth hereinabove, according to one or more exemplary embodiments, contact holes connected to each of the wirings are arranged in a zigzag manner on a plane to increase the path of current. Accordingly, the resistance of the wirings connected through the contact holes may be reduced, and thus the display device may substantially prevent burn defects due to overcurrent.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first substrate;
a first conductive line disposed on the first substrate;
an insulating layer disposed on the first conductive line;
a second conductive line disposed on the first conductive line and the insulating layer;
a protective layer disposed on the second conductive line;
a plurality of first contact holes defined by the insulating layer and the protective layer;
a plurality of second contact holes defined by the protective layer; and
a conductive layer disposed over the plurality of first contact holes and the plurality of second contact holes, and connecting the first conductive line and the second conductive line,
wherein:
the plurality of first contact holes and the plurality of second contact holes are arranged alternately along a first direction and along a second direction which intersects the first direction and are immediately adjacent to each other in both the first and second directions with only the protective layer disposed therebetween;
a first one of the first contact holes is adjacent to a first one of the second contact holes in the first direction and adjacent to a second one of the second contact holes in the second direction; and
a second one of the first contact holes is adjacent to the second one of the second contact holes in the first direction and adjacent to the first one of the second contact holes in the second direction.

2. The display device of claim 1, wherein the conductive layer further comprises a plurality of first contact portions that contact the first conductive line through the plurality of first contact holes.

3. The display device of claim 2, wherein the second conductive line encloses each of the plurality of first contact portions on a plane.

4. The display device of claim 1, wherein the conductive layer further comprises a plurality of second contact portions that contact the second conductive line through the plurality of second contact holes.

5. The display device of claim 4, wherein the plurality of second contact portions overlap the first conductive line.

6. The display device of claim 1, wherein the second conductive line extends along the second direction in a zigzag manner on the first conductive line.

7. The display device of claim 1, wherein the second conductive line comprises a stem portion and a branch portion in an area overlapping the conductive layer, the stem portion extending along the second direction and the branch portion extending from the stem portion along the first direction.

8. The display device of claim 7, wherein the first conductive line has at least one first opening area.

9. The display device of claim 8, wherein the stem portion overlaps the first opening area, and only a part of the branch portion overlaps the first opening area.

10. The display device of claim 1, wherein the second conductive line has a plurality of second opening areas corresponding to the plurality of first contact holes.

11. A display device comprising:
a first substrate;
a gate line disposed on the first substrate;
a gate driver connected to the gate line;
a clock line for transmitting a clock signal;
a gate insulating layer disposed on the gate line and the clock line;
a plurality of first contact holes defined by the gate insulating layer;
a connection line disposed on the gate line, the clock line, and the gate insulating layer, the connection line connecting the clock line and the gate driver;
a protective layer disposed on the connection line;
a plurality of second contact holes defined by the protective layer;
a conductive layer disposed over the plurality of first contact holes and the plurality of second contact holes and connecting the clock line and the connection line,
wherein the plurality of first contact holes and the plurality of second contact holes are arranged alternately along a first direction and along a second direction which intersects the first direction.

12. The display device of claim 11, wherein the plurality of second contact holes overlap the clock line.

13. The display device of claim 11, wherein the connection line extends along the second direction in a zigzag manner on the clock line.

14. The display device of claim 11, wherein the connection line comprises a stem portion and a branch portion in an area overlapping the conductive layer, the stem portion extending along the second direction and the branch portion extending from the stem portion along the first direction.

15. The display device of claim 14, wherein the clock line has at least one first opening area.

16. The display device of claim 15, wherein the stem portion overlaps the first opening area, and only a part of the branch portion overlaps the first opening area.

17. The display device of claim 15, wherein the connection line has a plurality of second opening areas corresponding to the plurality of first contact holes.

18. The display device of claim 17, wherein:
the clock line comprises a first clock line and a second clock line spaced apart from the first clock line by a predetermined pitch; and
a sum of a width of an area where the first opening area and the second opening area overlap each other and an interval between the first clock line and the second clock line is substantially equal to or greater than about 30% of the pitch.

19. The display device of claim 11, wherein the connection line encloses each of the plurality of first contact portions on a plane.

20. The display device of claim 11, further comprising:
a second substrate opposing the first substrate; and
a sealing member disposed between the clock line and the second substrate,
wherein the sealing member has a width substantially equal to or greater than about 1.0 mm and substantially equal to or less than about 3.5 mm.

* * * * *